(12) United States Patent
Yao et al.

(10) Patent No.: US 11,448,318 B2
(45) Date of Patent: Sep. 20, 2022

(54) SEAL RING STRUCTURE

(71) Applicant: UNITED MICROELECTRONICS CORP., Hsin-Chu (TW)

(72) Inventors: Hai Biao Yao, Singapore (SG); Su Xing, Singapore (SG); Jinyu Liao, Singapore (SG); Purakh Raj Verma, Singapore (SG)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 253 days.

(21) Appl. No.: 16/889,816

(22) Filed: Jun. 2, 2020

(65) Prior Publication Data

US 2021/0348684 A1    Nov. 11, 2021

(30) Foreign Application Priority Data

May 8, 2020  (TW) .................................. 109115294

(51) Int. Cl.
| | |
|---|---|
| *H01L 23/58* | (2006.01) |
| *F16J 15/06* | (2006.01) |
| *H05K 9/00* | (2006.01) |
| *H01L 23/00* | (2006.01) |

(52) U.S. Cl.
CPC ............ *F16J 15/06* (2013.01); *H01L 23/562* (2013.01); *H01L 23/564* (2013.01); *H01L 23/585* (2013.01); *H05K 9/0015* (2013.01)

(58) Field of Classification Search
CPC ........ F16J 15/06; F16J 15/064; H05K 1/0243; H05K 1/181; H05K 9/0015; H05K 2201/09009; H01L 23/562; H01L 23/585; H01L 23/564; H01L 2924/0002; H01L 2924/00; H01L 23/28; H01L 23/58
See application file for complete search history.

(56) References Cited

U.S. PATENT DOCUMENTS

| | | | |
|---|---|---|---|
| 6,399,897 B1 * | 6/2002 | Umematsu ........... | H05K 1/0271 257/737 |
| 6,455,910 B1 * | 9/2002 | Wang .................... | H01L 23/564 257/605 |
| 6,943,063 B2 | 9/2005 | Tsai | |
| 8,836,133 B2 * | 9/2014 | Huang .................. | H01L 23/585 257/E21.585 |
| 9,070,683 B2 | 6/2015 | Fender | |
| 2003/0173675 A1 * | 9/2003 | Watanabe ................. | G03F 1/26 438/626 |
| 2009/0079039 A1 * | 3/2009 | Fujita .................... | H01L 23/585 257/E23.002 |
| 2009/0140391 A1 * | 6/2009 | Hou ...................... | H01L 23/585 257/E23.18 |

(Continued)

*Primary Examiner* — Steven T Sawyer
(74) *Attorney, Agent, or Firm* — Winston Hsu

(57) ABSTRACT

The invention provides a seal ring structure, which comprises a substrate, and a seal ring positioned on the substrate, wherein the seal ring comprises an inner seal ring comprising a plurality of inner seal units, wherein each of the inner seal units is arranged at intervals with each other, an outer seal ring comprising a plurality of outer seal units arranged at the periphery of the inner seal ring, wherein each of the outer seal units is arranged at intervals with each other, and a plurality of groups of fence-shaped seal units, wherein at least one group of fence-shaped seal units is positioned between one of the inner seal units and the other adjacent outer seal unit.

14 Claims, 5 Drawing Sheets

(56) References Cited

U.S. PATENT DOCUMENTS

| | | | |
|---|---|---|---|
| 2010/0084751 A1* | 4/2010 | Frederick, Jr. | H01L 23/585 257/E23.18 |
| 2010/0203701 A1* | 8/2010 | Kim | H01L 23/585 257/E21.599 |
| 2013/0256826 A1* | 10/2013 | Gambino | H01L 29/0619 257/496 |
| 2018/0047648 A1* | 2/2018 | Wu | H01L 22/34 |
| 2018/0096955 A1* | 4/2018 | Zhu | H01L 23/53271 |
| 2020/0219826 A1* | 7/2020 | Wu | H01L 23/5386 |

* cited by examiner

US 11,448,318 B2

SEAL RING STRUCTURE

BACKGROUND OF THE INVENTION

1. Field of the Invention

The invention relates to the field of semiconductors, in particular to a seal ring structure.

2. Description of the Prior Art

With the improvement of integrated circuit (IC) speed, seal ring has been integrated into equipment seal to reduce radio frequency (RF) interference and signal cross coupling. The seal ring may be grounded or connected to a grounded signal, such as a DC voltage power line, to reduce interference. In some cases, the sealing ring may be part of the seal of the device, where a conductive lid is typically connected to the sealing ring. The sealing ring may be incorporated into the IC fabrication and may include a conductive covering over the substrate.

Conventional sealing rings are usually composed of one or more interconnected conductive metal layers. Seen from the top view, it is a closed shape, and the closed area of the sealing ring contains RF circuit or other pads and other components, wherein the pads may be connected with input or output signals. However, this structure will cause a problem in that the signal of the pad will be coupled to the sealing ring, causing signal interference. In addition, since the RF circuit is used for signal transmission, the sealing ring will also block the signal transmission of the RF circuit.

SUMMARY OF THE INVENTION

The invention provides a seal ring structure, which comprises a substrate, and a seal ring positioned on the substrate, wherein the seal ring comprises an inner seal ring comprising a plurality of inner seal units, wherein each of the inner seal units is arranged at intervals with each other, an outer seal ring comprising a plurality of outer seal units arranged at the periphery of the inner seal ring, wherein each of the outer seal units is arranged at intervals with each other, and a plurality of groups of fence-shaped seal units, wherein at least one group of fence-shaped seal units is positioned between one of the inner seal units and the other adjacent outer seal unit.

The invention is characterize in that since that fence-shaped seal structure is arrange between the inner seal ring and the out seal ring, the width of the gap between the inner seal ring and the outer seal ring is significantly reduced, and therefore moisture can be effectively prevented from entering the circuit element from the gap between the inner seal ring and the outer seal ring. It is worth noting that in this embodiment, after the fence-shaped seal structure is provided, the inner seal ring and the outer seal ring are not completely contacted to form a closed structure, that is, a curved path (snake path) is still left. Therefore, the influence on the signal transmission effect of the circuit elements is also small. Therefore, while preventing moisture from entering the low dielectric constant material and the circuit element, the performance of the circuit element can be maintained. In addition, in the invention, the seal ring is designed as a bevel edge at the corner, so that the seal ring at the corner is relative far away from the dicing paths, and the effect of protecting the central circuit element can be achieved.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention to users skilled in the technology of the present invention, preferred embodiments are detailed as follows. The preferred embodiments of the present invention are illustrated in the accompanying drawings with numbered elements to clarify the contents and the effects to be achieved.

Please note that the Figures are only for illustration and the Figures may not be to scale. The scale may be further modified according to different design considerations. When referring to the words "up" or "down" that describe the relationship between components in the text, it is well known in the art and should be clearly understood that these words refer to relative positions that can be inverted to obtain a similar structure, and these structures should therefore not be precluded from the scope of the claims in the present invention.

Figure 1:
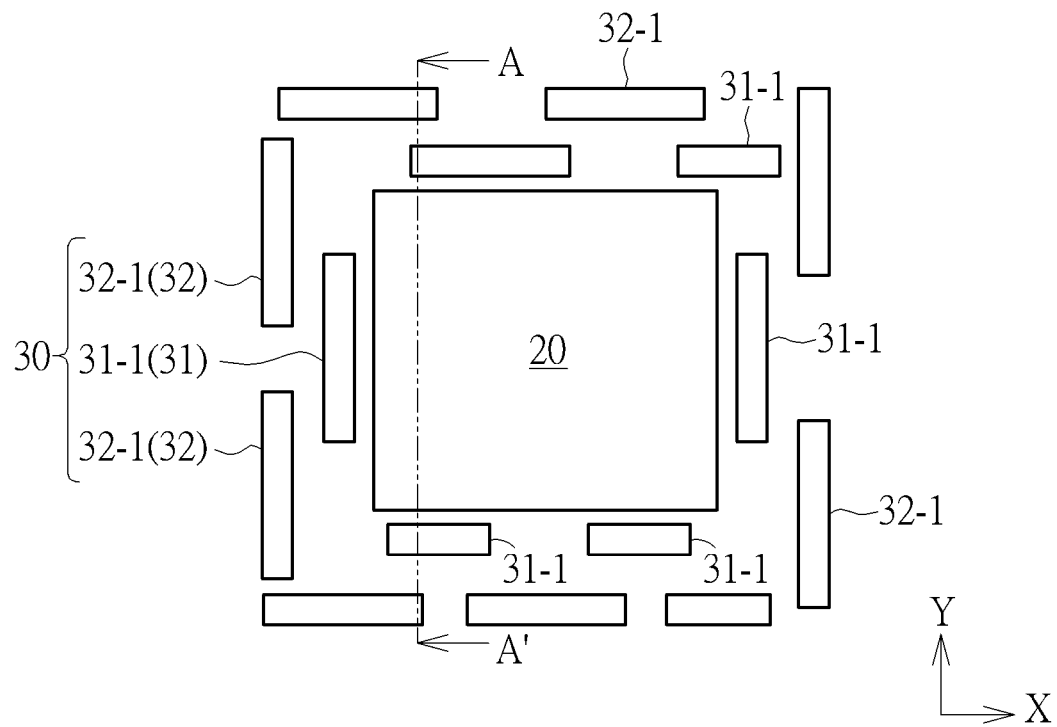
FIG. 1 is a schematic top view of a semiconductor structure according to a first preferred embodiment of the present invention.
Figure 2:
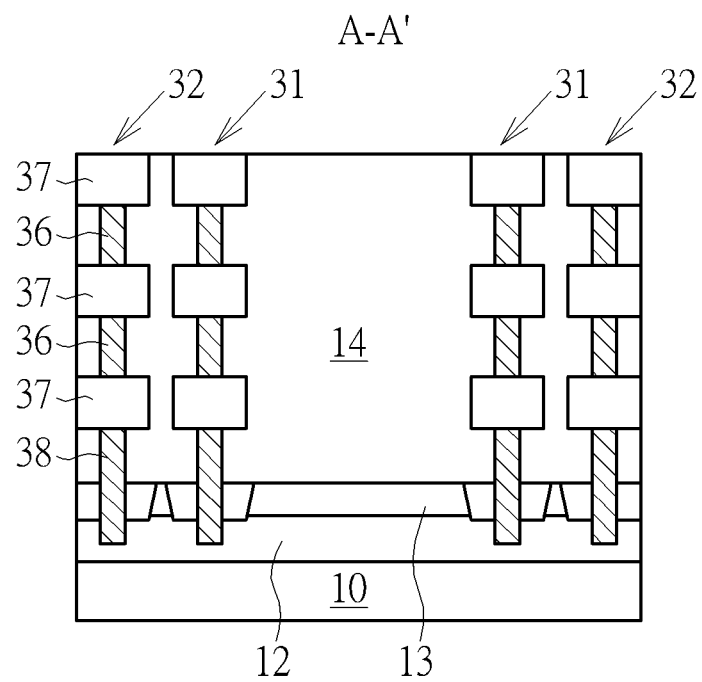
FIG. 2 shows a schematic cross-sectional view of the semiconductor structure according to FIG. 1 taken along the cross-sectional line A-A'.
Figure 3:
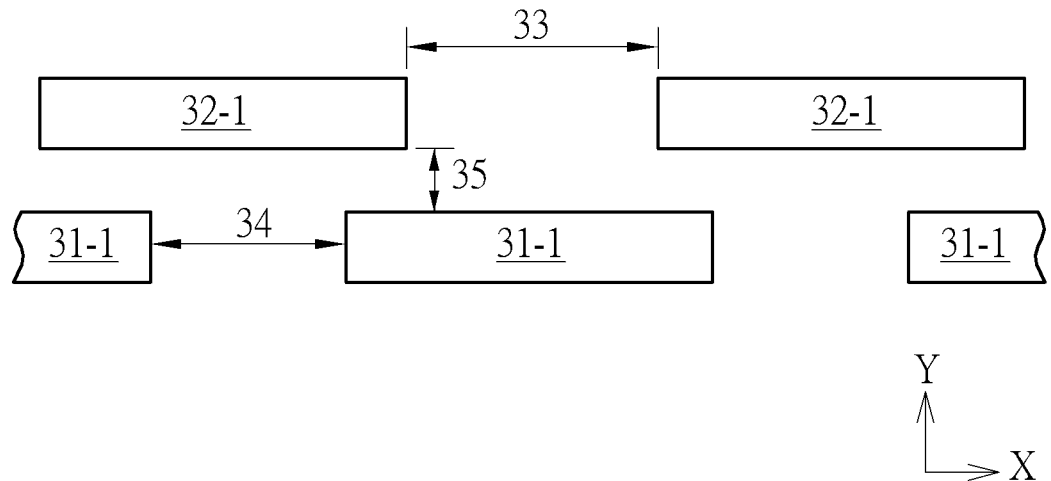
FIG. 3 shows a partial enlarged view of the seal ring in FIG. 2.

Please refer to FIGS. 1-3. FIG. 1 shows a schematic top view of a semiconductor structure according to a first preferred embodiment of the present invention, FIG. 2 shows a schematic cross-sectional view of the semiconductor structure according to FIG. 1 along the cross-sectional line A-A', and FIG. 3 shows a partial enlarged view of the seal ring in FIG. 2. The semiconductor structure of the present invention includes a substrate 10, on which there are an oxide layer 12, a semiconductor layer 13 and a dielectric layer 14. The substrate 10 is, for example, a silicon substrate, a silicon germanium substrate, a silicon carbide substrate, or a substrate made of other semiconductor materials, but not limited to. The oxide layer 12 is, for example, a silicon oxide layer; the semiconductor layer 13 is, for example, a silicon layer; and the dielectric layer 14 is preferably a low-k material, and the dielectric constant (k) is preferably less than 3, but is not limited thereto. A circuit element 20 and a seal ring 30 are disposed on the substrate 10, wherein the seal ring 30 located at the periphery of the circuit element 20. In other words, the seal ring 30 surrounds the circuit element 20. In this embodiment, the circuit element 20 is, for example, an RF (radio frequency) circuit element, and other electronic elements may be included in addition to the RF circuit, but only the RF circuit element is taken as an example for the sake of simplicity of the drawing. The RF circuit in this embodiment can be mainly used for wireless communication, but is not limited thereto.

The seal ring 30 surrounds the periphery of the circuit element 20. As mentioned in the prior art, the conventional seal ring is a completely closed structure. This closed structure may shield signals emitted by the circuit element and reduce the sensitivity of the circuit element. Therefore, in this embodiment, the seal ring 30 is divided into two parts: an inner seal ring 31 and an outer seal ring 32, wherein the inner seal ring 31 comprises a plurality of inner seal units 31-1, each inner seal unit 31-1 is arranged at intervals and surrounds the circuit element 20, and an opening 33 is left between every two adjacent inner seal units 31-1. That is, a plurality of inner seal units 31-1 constitute an inner seal ring 31. Similarly, the outer seal ring 32 includes a plurality of outer seal units 32-1, each of which is spaced apart from each other and surrounds the circuit element 20, and an opening 34 is left between each two adjacent outer seal units 32-1. That is, a plurality of outer seal units 32-1 constitute an outer seal ring 32. In addition, the outer seal ring 32 is arranged around the outer side of the inner seal ring 31.

Referring again to FIG. 2, in this embodiment, the inner seal ring 31 or the outer seal ring 32 each includes a plurality of conductive plugs 36 and conductive layers 37 stacked alternately, and also includes a contact structure 38 at the bottom of each seal ring, wherein the contact structure 38 is used to connect the seal ring and the substrate 10, and can ground the seal ring. The conductive plug 36, the conductive layer 37, and the contact structure 38 may include conductive materials such as metal, including such as tungsten, gold, copper, aluminum, and the like, but are not limited thereto.

Referring to FIG. 3, it should be noted that the arrangement position of each outer seal unit 32-1 preferably corresponds to the opening 33 between two adjacent inner seal units 31-1. For example, in FIG. 3, two adjacent inner seal units 31-1 are arranged in a first direction (e.g., the X-axis), while the outer seal units 32-1 correspond to the positions of the openings 33 in a second direction (e.g., the Y-axis). In addition, along the second direction (e.g., the Y-axis), a portion of the outer seal unit 32-1 overlaps with the first seal unit 31-1 (e.g., the left and right sides of the outer seal unit 32-1 in FIG. 3). In addition, the inner seal ring 31 and the outer seal ring 32 are not completely closed, leaving a gap 35 between the two seal rings. The advantage of this seal ring structure is that the inner seal ring 31 and the outer seal ring 32 are used to surround the circuit element 20, but some gaps 35 are left between the two seal rings, thus having less influence on the signal transmission of the circuit element 20. For example, if the circuit element 20 is an RF circuit, when wireless transmission is required, wireless signals are less susceptible to shielding interference because the two seal rings are not fully closed, and the RF circuit can be protected because the RF circuit is still surrounded by the seal rings.

In the following, different embodiments of the seal ring of the present invention will be described, and in order to simplify the description, the following description will mainly detail the differences of the embodiments, and will not repeat the same details. In addition, the same elements in various embodiments of the present invention are labeled with the same reference numerals to facilitate cross-reference between various embodiments.

The seal ring according to the first embodiment still has some disadvantages, that is, when the wafer (the substrate 10) is cut, the wafer may be cooled with water. However, at this time, moisture may pass through the low-k material (the dielectric layer 14) to the circuit element 20 along the gap 35, thereby affecting the quality of the circuit element 20. In addition, some specific low-k materials are easy to react with water. For example, fluorinated silicate glass (FSG) will generate hydrogen fluoride when encountering water, thus corroding metal materials (e.g., the circuit element 20).

Figure 4:
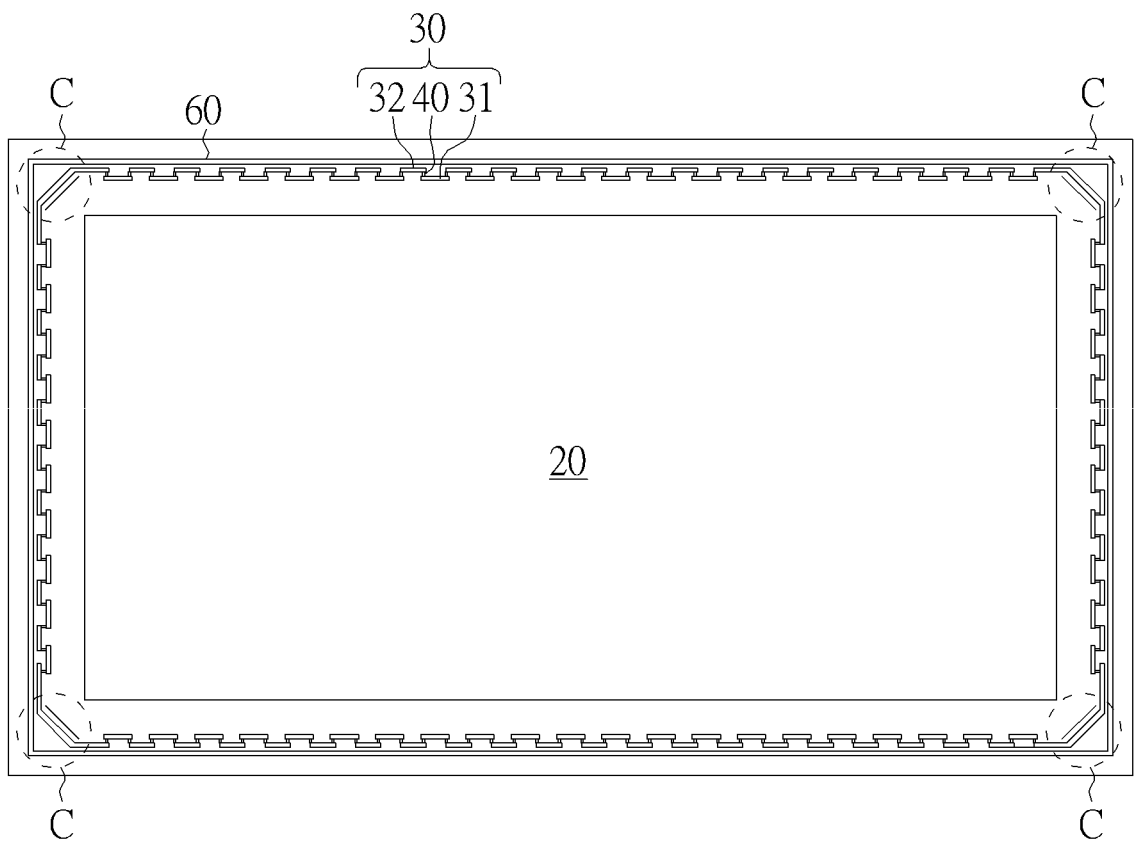
FIG. 4 is a schematic top view of a semiconductor structure according to a second preferred embodiment of the present invention.
Figure 5:
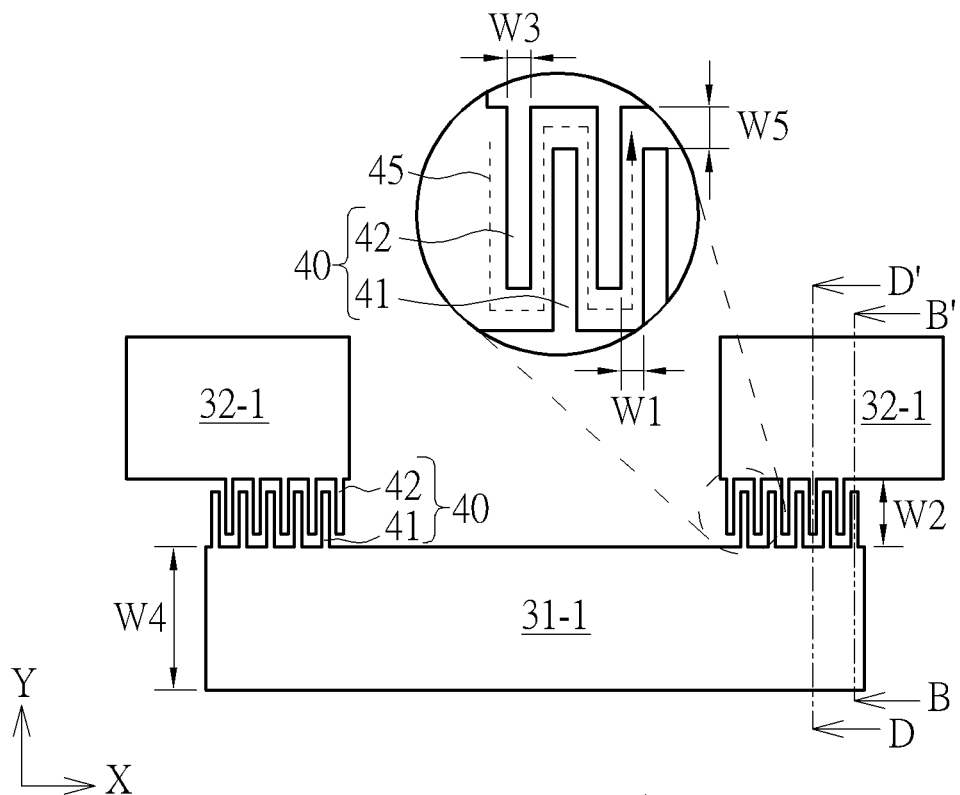
FIG. 5 shows a partial enlarged view of the seal ring in FIG. 4.
Figure 6:
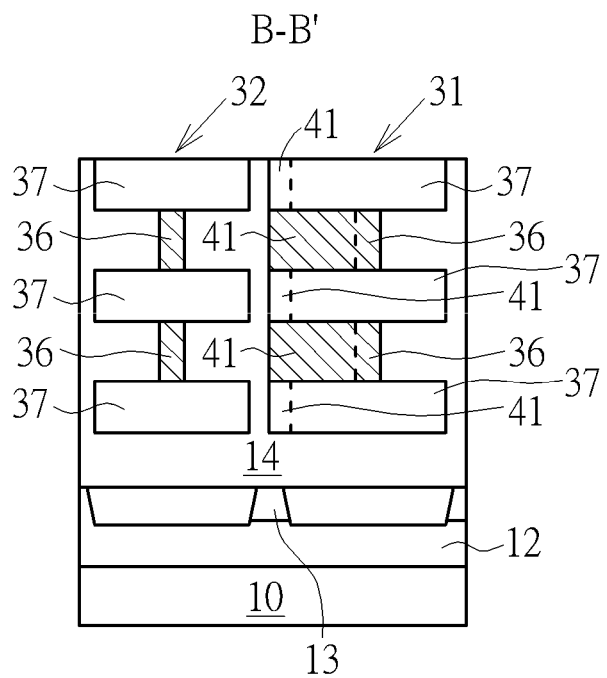
FIG. 6 shows a schematic cross-sectional view of the semiconductor structure according to FIG. 5 taken along the cross-sectional line B-B'.
Figure 7:
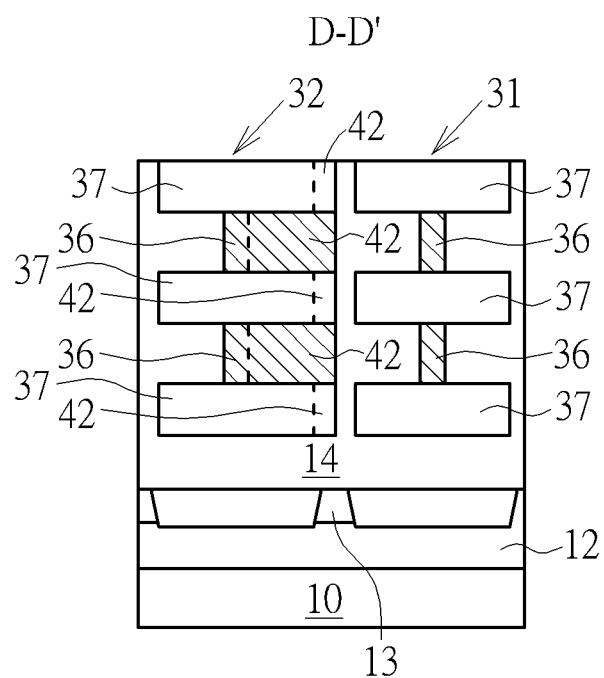
FIG. 7 shows a schematic cross-sectional view of the semiconductor structure according to FIG. 5 taken along the cross-sectional line D-D'.

Please refer to FIGS. 4-7. FIG. 4 shows a schematic top view of a semiconductor structure according to a second preferred embodiment of the present invention, FIG. 5 shows an enlarged partial view of the seal ring in FIG. 4, FIG. 6 shows a schematic cross-sectional view of the semiconductor structure according to FIG. 5 taken along section line B-B', and FIG. 7 shows a schematic cross-sectional view of the semiconductor structure according to FIG. 5 taken along section line D-D'. As shown in FIG. 4, this embodiment is similar to the above-mentioned first preferred embodiment. The seal ring 30 also includes an inner seal ring 31 and an outer seal ring 32. the inner seal ring 31 includes a plurality of inner seal units 31-1 arranged at intervals, and the outer seal ring 32 includes a plurality of outer seal units 32-1 arranged at intervals.

The difference between the present invention and the first preferred embodiment is that a plurality of groups of fence-shaped seal structures 40 are further formed at each gap 35 between the inner seal unit 31-1 and the outer seal unit 32-1, wherein the arrangement direction of the fence-shaped seal structures 40 is perpendicular to the inner seal unit 31-1, and the arrangement direction of the fence-shaped seal structures 40 is also perpendicular to the outer seal unit 32-1. For example, in FIG. 5, the fence-shaped seal structures 40 are arranged in the Y-axis direction, while the inner seal unit 31-1 and the outer seal unit 32-1 are arranged in the X-axis direction.

Referring to FIG. 5, the fence-shaped seal structure 40 includes a plurality of groups of first fence-shaped seal structures 41 and a plurality of groups of second fence-shaped seal structures 42 arranged alternately. In which each of the first fence-shaped seal structures 41 contacts the inner seal unit 31-1 and each of the second fence-shaped seal structures 42 contacts the outer seal unit 32-1, but each of the first fence-shaped seal structures 41 and each of the second fence-shaped seal structures 42 do not contact each other. Therefore, a curved path (or a snake path) 45 is still left between each first fence-shaped seal structure 41 and each second fence-shaped seal structure 42. It is worth noting that in this embodiment, the width of the curved path 45 is much smaller than the gap 35 (refer to FIG. 3) in the above-mentioned first embodiment. Preferably, a width W1 of the curved path 45 (i.e., the minimum distance between the first fence-shaped seal structure 41 and the adjacent second fence-shaped seal structure 42) is much smaller than the width W2 between the inner seal ring 31 and the outer seal ring 32 (also corresponding to the gap 35 in the first embodiment). In some embodiments, W2/W1>10, but not limited thereto.

In addition, the width of each of the first fence-shaped seal structures 41 or each of the second fence-shaped seal structures 42 is much smaller than the widths of the inner seal unit 31-1 and the width of the outer seal unit 32-1. For example, please refer to FIG. 5, take the inner seal unit 31-1 and the first fence-shaped seal structure 41 as examples, the width of the first fence-shaped seal structure 41 is defined as W3, and the width of the inner seal unit 31-1 is defined as W4, wherein W4/W3>20 is preferred, but the present invention is not limited thereto.

In addition, the distance or the width (for example, along the Y-axis direction) of the first fence-shaped seal structure 41 from the outer seal unit 32-1 is defined as W5. In this embodiment, preferably, W2/W5>3, but not limited thereto.

Adjusting the ratio of the widths W1 to W5 is helpful to prevent the moisture from entering the seal ring through the gaps, thus achieving the effect of more protecting the inner circuit elements.

Figure 8:
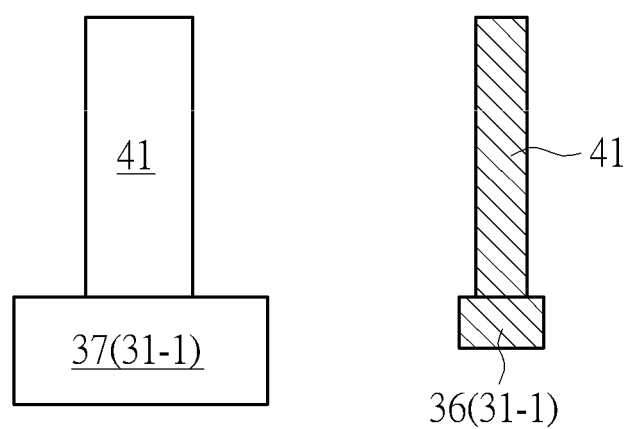
FIG. 8 is a schematic top view of a first fence-shaped seal structure in which that conductive layer is connected to the conductive plug.

In this embodiment, the first fence-shaped seal structure 41 and the second fence-shaped seal structure 42 may be formed simultaneously with the inner seal ring 31 or the outer seal ring 32. In some embodiments, the first fence-shaped seal structure 41 and the inner seal ring 31 may be integrally formed, and similarly, the second fence-shaped seal structure 42 and the outer seal ring 32 may be integrally formed. Please refer to FIG. 6, FIG. 7 and FIG. 8. FIG. 6 shows a schematic cross-sectional view of the semiconductor structure according to FIG. 5 taken along the cross-sectional line B-B', FIG. 7 shows a schematic cross-sectional view of the semiconductor structure according to FIG. 5 taken along the cross-sectional line D-D', and FIG. 8 shows a schematic top view of the first fence-shaped seal structure in which the conductive layer is connected to the conductive plug. The first fence-shaped seal structure 41 may be directly connected to the conductive plug 36 and/or the conductive layer 37 of the inner seal ring 31, while the second fence-shaped seal structure 42 may be directly connected to the conductive plug 36 and/or the conductive layer 36 of the outer seal ring 32. As shown in FIG. 8, the left side of FIG. 8 shows a schematic diagram of the conductive layer 37 of the first seal unit 31 connected to the first fence-shaped seal structure 41, and the right side of FIG. 8 shows a schematic diagram of the conductive plug 36 of the first seal unit 31 connected to the first fence-shaped seal structure 41. It should be noted that in FIG. 8, the conductive layer 37 and the conductive plug 36 are respectively shown on both sides for convenience of illustration, but in fact the conductive layer 37 and the conductive plug 36 should overlapped with each other. In addition, the outer seal ring 32 is connected to the second fence-shaped seal structure 42, and the top view structure is similar to the connection method of the inner seal ring 31 and the first fence-shaped seal structure 41 depicted in FIG. 8, and therefore will not be described in detail.

In addition, in other embodiments, the fence-shaped seal structure 40 may be formed only beside the conductive layer 37 but not beside the conductive plug 36, that is, the first fence-shaped seal structure 41 may be formed beside the conductive layer 37 of the inner seal ring 31 and can be electrically connected to the conductive layer 37, but not beside the conductive plug 36 of the inner seal ring 31; The second fence-shaped seal structure 42 may be formed beside the conductive layer 37 of the outer seal ring 32 and can be electrically connected to the conductive layer 37, but not formed beside the conductive plug 36 of the outer seal ring 32, which is also within the scope of the present invention.

Figure 9:
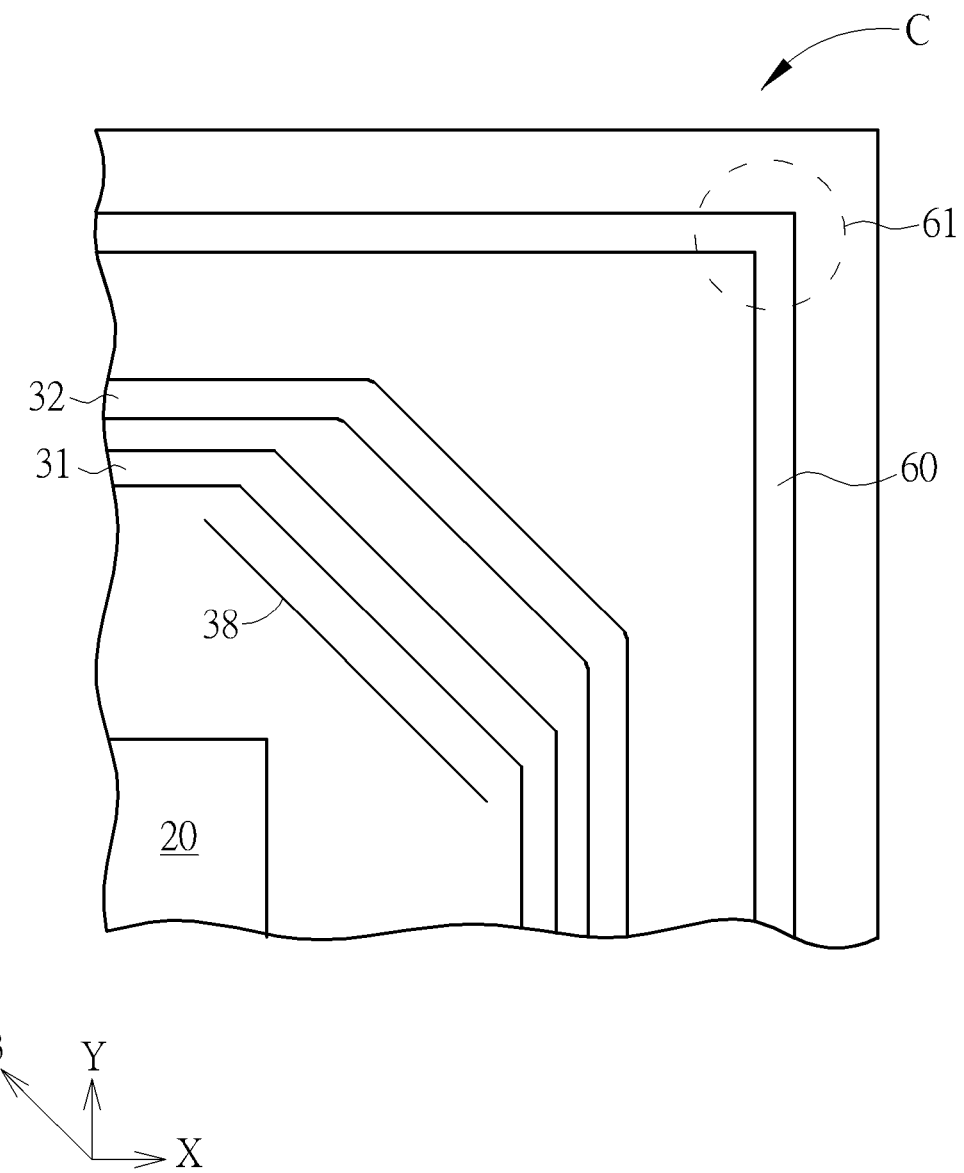
FIG. 9 is an enlarged partial view of the corner of the seal ring in this embodiment.

In addition, please refer to FIG. 9, which shows a partial enlarged view of the corner of the seal ring in this embodiment. In this embodiment, the inner seal ring 31 and the outer seal ring 32 surround the circuit element 20. At the corner of the seal ring (e.g., corner C in FIG. 4), the seal ring can be designed in the shape of a bevel edge. For example, in this embodiment, the seal rings surrounding the circuit element 20 are mainly arranged in a first direction (e.g., the X direction) or a second direction (e.g., the Y direction), while the inner seal ring 31 and the outer seal ring 32 located at the corners are both designed to be beveled and arranged in a third direction (e.g., the D3 direction, where D3 is, for example, a 45 degree angle, but is not limited thereto). Since in the subsequent wafer dicing process, the dicing paths 60 is more likely to generate greater stress and may damage the surrounding seal ring, by this design, the seal ring at the corner can be kept away from the dicing paths 60 (e.g., the dicing path 61 in FIG. 9), which can reduce the damage to the seal ring during the dicing process.

In addition, in the present invention, it is not necessary to form a contact structure 38 under each of the inner seal units or each of the outer seal units, but it is possible to choose to form a contact structure under only a portion of the inner seal units or under a portion of the outer seal units to connect the substrates. For example, contact structures can be formed near four corners of the seal ring to be grounded, and the rest contact structures are omitted. The above structure is also within the scope of the present invention.

The invention is characterized in that since the fence-shaped seal structure 40 is arranged between the original inner seal ring 31 and the outer seal ring 32, the width of the gap 35 between the inner seal ring 31 and the outer seal ring 32 is significantly reduced, so that moisture can be effectively prevented from entering the circuit element 20 from the gap between the inner seal ring 31 and the outer seal ring 32. It should be noted that in this embodiment, after the fence-shaped seal structure 40 is provided, the inner seal ring 31 and the outer seal ring 32 are not completely contacted to form a closed structure, that is, the curved path (snake path) 45 is still left. Therefore, the influence on the signal transmission effect of the circuit element 20 is also small. Therefore, while preventing moisture from entering the low dielectric constant material 14 and the circuit element 20, the performance of the circuit element 20 can be maintained. In addition, in the invention, the seal ring is designed as a bevel edge at the corner, so that the seal ring at the corner is far away from the dicing paths, and the effect of protecting the central circuit element can be achieved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A seal ring structure comprising:
a substrate; and
a seal ring located on the substrate, wherein the seal ring comprises:
an inner seal ring comprising a plurality of inner seal units, wherein each of the inner seal units is arranged at intervals;
an outer seal ring comprising a plurality of outer seal units arranged at the periphery of the inner seal ring, wherein the outer seal units are arranged at intervals with each other; and
a plurality of groups of fence-shaped seal structures, wherein at least one group of fence-shaped seal structures is located between one of the inner seal units and another adjacent outer seal unit, wherein each group of the fence-shaped seal structures comprises a plurality of first fence-shaped seal structures connected to each inner seal ring unit and a plurality of second fence-shaped seal structures connected to each outer seal ring unit; and a dicing path, surrounding the seal ring, wherein there is no other elements disposed between the dicing path and the outer seal ring, and wherein at least one of the first fence-shaped seal structure or the second fence-shaped seal structure is exposed to the dicing path.

2. The seal ring structure according to claim 1, wherein each of the first fence-shaped seal structures does not directly contact each of the second fence-shaped seal structures.

3. The seal ring structure according to claim 1, wherein parts of the inner seal unit and part of the outer seal unit are arranged in a first direction, and each of the first fence-shaped seal structure and each of the second fence-shaped seal structure are arranged in a second direction, wherein the first direction and the second direction are perpendicular to each other.

4. The seal ring structure according to claim 1, wherein a minimum distance between the first fence-shaped seal structure and the adjacent second fence-shaped seal structure is W1, and a minimum distance between any one of the inner seal units and the adjacent outer seal unit is defined as W2, wherein W2/W1>10.

5. The seal ring structure according to claim 1, wherein a minimum width of any of the first fence-shaped seal structures is W3, and a minimum width of any of the inner seal units is W4, wherein W4/W3>20.

6. The seal ring structure according to claim 3, wherein the inner seal ring and the outer seal ring are arranged along a third direction in a corner portion, wherein the third direction is different from the first direction and the second direction.

7. The seal ring structure according to claim 6, wherein the inner seal ring and the outer seal ring have a bevel edge at the corner portion.

8. The seal ring structure according to claim 1, further comprising a plurality of openings between any two adjacent inner seal units, and each outer seal unit is arranged corresponding to the openings.

9. The seal ring structure according to claim 1, wherein each inner seal unit or each outer seal unit comprises a plurality of vertically stacked contact plugs and conductive layers.

10. The seal ring structure according to claim 9, wherein at least one contact plug is electrically connected to the substrate.

11. The seal ring structure according to claim 10, wherein the contact plug contacting the substrate is located at a corner portion of the inner seal ring.

12. The seal ring structure according to claim 1, further comprising a circuit element on the substrate.

13. The seal ring structure according to claim 12, wherein the seal ring surrounds the circuit element.

14. The seal ring structure according to claim 12, wherein the circuit element comprises a RF circuit.

* * * * *